United States Patent
Luo

(10) Patent No.: US 11,228,017 B2
(45) Date of Patent: Jan. 18, 2022

(54) PACKAGING COVER PLATE, METHOD FOR MANUFACTURING THE SAME AND LIGHT EMITTING DIODE DISPLAY

(71) Applicant: BOE Technology Group Co., Ltd., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 118 days.

(21) Appl. No.: 16/111,512

(22) Filed: Aug. 24, 2018

(65) Prior Publication Data
US 2019/0115558 A1   Apr. 18, 2019

(30) Foreign Application Priority Data
Oct. 13, 2017  (CN) .......................... 201710953291.X

(51) Int. Cl.
*H01L 51/52* (2006.01)
*H01L 51/54* (2006.01)
(Continued)

(52) U.S. Cl.
CPC ........ *H01L 51/524* (2013.01); *H01L 51/0097* (2013.01); *H01L 51/529* (2013.01); *H01L 51/56* (2013.01); *H01L 2251/5338* (2013.01)

(58) Field of Classification Search
CPC ....... Y10T 428/2457; Y10T 428/24579; B32B 3/30; H01L 51/524; H01L 51/529; H01L 51/5237; H01L 51/5253; H01L 2251/5338
See application file for complete search history.

(56) References Cited

U.S. PATENT DOCUMENTS

| 6,562,180 B1 * | 5/2003 | Bohin | ..................... C08L 83/04 |
| | | | 156/329 |
| 7,292,440 B2 * | 11/2007 | Cho | ................... H05K 7/20963 |
| | | | 165/185 |

(Continued)

FOREIGN PATENT DOCUMENTS

| CN | 201838628 U | 5/2011 |
| CN | 103373017 A | 10/2013 |

(Continued)

OTHER PUBLICATIONS

Office Action dated Sep. 29, 2018 issued in corresponding Chinese Application No. 201710953291 X.

(Continued)

*Primary Examiner* — Joanna Pleszczynska
(74) *Attorney, Agent, or Firm* — Nath, Goldberg & Meyer; Joshua B. Goldberg

(57) ABSTRACT

The present disclosure provides a packaging cover plate, a method for manufacturing the same and a light emitting diode display, the packaging cover plate includes a cover plate body and a groove structure disposed on a first surface of the cover plate body, wherein the cover plate body comprises a flexible ceramic material, and the groove structure is filled with an adhesive material and a thermally conductive material. The packaging cover plate provided by the present disclosure has a bending property while having a barrier to water and oxygen, and does not undergo a shape change due to thermal expansion and contraction under a change of the ambient temperature. In addition, the present disclosure can improve the adhesion between the package cover plate and the packaging adhesive and improve the heat dissipation effect.

3 Claims, 3 Drawing Sheets

(51) Int. Cl.
   *B32B 3/30*      (2006.01)
   *H01L 51/00*     (2006.01)
   *H01L 51/56*     (2006.01)

(56) References Cited

U.S. PATENT DOCUMENTS

| | | | |
|---|---|---|---|
| 9,532,633 B1* | 1/2017 | Tan | A45C 13/08 |
| 2010/0078343 A1* | 4/2010 | Hoellwarth | G06F 3/041 |
| | | | 206/320 |
| 2011/0083836 A1 | 4/2011 | Kobayashi | |
| 2013/0228276 A1 | 9/2013 | Chang | |
| 2013/0280519 A1* | 10/2013 | Hsiao | H05K 1/0373 |
| | | | 428/325 |
| 2014/0159017 A1 | 6/2014 | Ikeda et al. | |
| 2016/0055793 A1* | 2/2016 | Jang | B32B 15/20 |
| | | | 345/76 |
| 2016/0359132 A1 | 12/2016 | Sun | |
| 2017/0092709 A1* | 3/2017 | Choi | H01L 51/5237 |
| 2017/0263833 A1* | 9/2017 | Chiu | H01L 33/62 |

FOREIGN PATENT DOCUMENTS

| | | |
|---|---|---|
| CN | 103872260 A | 6/2014 |
| CN | 104600208 A | 5/2015 |
| CN | 205104479 U | 3/2016 |
| CN | 105977398 A | 9/2016 |
| CN | 106571345 A | 4/2017 |
| CN | 206076240 U | 4/2017 |
| CN | 107221607 A | 9/2017 |
| WO | 2012/061985 A1 | 5/2012 |

OTHER PUBLICATIONS

"Favorite in a New Material of Flexible Ceramics", Han Yongqi, New Materials Industry, pp. 60-62, Aug. 2014.
Office Action dated Jan. 6, 2020 issued in corresponding Chinese Application No. 201710953291 X.
Second Office Action of CN; Application No. 201710953291.X; dated May 31, 2019; With English Translation.
Han Yongqi, "Flexible ceramics—the darling of new materials"; INSIGHT Advanced Materials Industry; pp. 60-62, No. 8, 2014; With English Translation.

* cited by examiner

PACKAGING COVER PLATE, METHOD FOR MANUFACTURING THE SAME AND LIGHT EMITTING DIODE DISPLAY

CROSS-REFERENCE TO RELATED APPLICATION

This application claims the priority of Chinese Patent Application No. 201710953291.X entitled with "packaging cover plate and method for manufacturing the same" submitted on Oct. 13, 2017, the disclosure of which is incorporated herein in its entirety by reference.

TECHNICAL FIELD

The present disclosure relates to the field of display technology, particularly to a light emitting diode display, a packaging cover plate for the display, and a method for manufacturing the same.

BACKGROUND

A Light Emitting Diode display, in particular OLED (Organic Light Emitting Diode), is a display lighting technology that has been gradually developed in recent years. Especially in the display industry, the Light Emitting Diode display is considered to have broad application prospects due to its high response, high contrast, and flexibility.

SUMMARY

The present disclosure provides a packaging cover plate, including a cover plate body and a groove structure disposed on a first surface of the cover plate body, wherein the cover plate body comprises a flexible ceramic material, and the groove structure is filled with an adhesive material and a thermally conductive material.

Optionally, the groove structure includes a first groove and a second groove that are isolated from each other, wherein
the first groove is filled with the adhesive material; and
the second groove is filled with the thermally conductive material.

Optionally, the first groove and the second groove are a linear long groove or a curved long groove;
Both the first groove and the second groove are a plurality of grooves and parallel to each other, and the first groove and the second groove are arranged between each other.

Optionally, the first groove and the second groove have a width of 0.5 mm to 1 mm. A length of the first groove and the second groove is generally larger than the length of the packaging region. That is, the first groove and the second groove extend to the outside of the packaging region. And the length of the first groove and the second groove may be set according to the size of the light emitting device, for example, preferably 3 cm to 220 cm. The interval between the adjacent first groove and the second groove is 0 to 1 mm. The first groove and the second groove have a depth of 10% to 50% of the depth of the packaging cover plate, for example, on the basis of a typical glass thickness of 0.5 mm, the depth of the first groove or the second groove is 0.05 mm-0.25 mm.

Optionally, the first groove is a polygon (such as regular hexagons, quadrilaterals, etc.); and the second groove is a polygonal groove surrounding the first groove.

Optionally, the first groove is a regular hexagonal groove; the second groove is a regular hexagonal ring groove surrounding the first groove; and the six sides of the first groove are in one-to-one correspondence with the inner six sides of the second groove.

Optionally, the second groove is a plurality of grooves, and the outer six sides of any one of the second groove coincide with the outer side of six of the second groove adjacent thereto, and a plurality of the second groove cover the entire first surface of the cover plate body;
the inner six sides of the second groove are in one-to-one correspondence with the six sides of the first groove, and coincide with the six sides of the first groove respectively.

Optionally, the flexible ceramic material is a composite material composed of a host material and a binder material;
the host material is at least one selected from the group consisting of $Al_2O_3$, BN, $ZrO_2$, MgO, $CeO_2$, $Y_2O_3$, $Si_3N_4$, and $La_2O_3$; and the binder material is at least one selected from the group consisting of epoxy resins, rubbers, and paraffin waxes.

Optionally, the adhesive material contains organosilane-based materials containing inorganic fillers.

Optionally, the thermally conductive material is at least one selected from the group consisting of graphene, carbon nanotubes, graphite powder, aluminum oxide, and aluminum nitride.

As another embodiment, the present disclosure also provides an organic light emitting diode display, including a substrate, an organic light emitting diode functional layer on the substrate, a packaging adhesive, the packaging cover plate described above and a drying member, wherein the packaging adhesive is applied on the first surface of the cover plate body, thereby completing the package.

As another embodiment, the present disclosure also provides a method for manufacturing a packaging cover plate, including:
a step of providing a cover plate body comprising a flexible ceramic material;
a step of forming a groove structure on the first surface of the cover plate body; and
a step of filling the groove structure with an adhesive material and a thermally conductive material.

Optionally, the step of filling the groove structure with an adhesive material and a thermally conductive material includes:
formulating the adhesive material into a solution (preferably a dilute solution having a concentration of 0.5% by mass to 1% by mass) using a solvent; and formulating the thermally conductive material into a paste using a solvent;
filling the solution into the groove structure by knife coating, spray coating or inkjet printing; and filling the paste into the groove structure by screen printing, spray coating or spot coating; and
drying the dilute solution and the paste in the groove structure.

Optionally, the step of forming a groove structure on the first surface of the cover plate body includes:
forming a first groove and a second groove that are isolated from each other on a first surface of the cover plate body,
filling the first groove with the adhesive material, and
filling the second groove with the thermally conductive material.

Optionally, the first groove and the second groove is each formed into a linear long groove, a curved long groove or a hexagonal groove. In the case of forming the hexagonal grooves, the first groove is configured as a regular hexagonal groove; the second groove is configured as a regular hexagonal ring groove surrounding the first groove; and the six sides of the first groove are in one-to-one correspondence with the inner six sides of the second groove.

DETAILED DESCRIPTION

In order to enable those skilled in the art to better understand the technical solutions of the present disclosure, the packaging cover plate and the method for manufacturing the same provided by the present disclosure will be described in detail below in conjunction with the companying drawings.

Recently, the emergence of curved and flexible OLED display devices is even more impressive. However, since the OLED display device may be corroded and damaged under an action of water vapor and oxygen, the current OLED display device is inseparable from protection of a packaging structure. If a curved or a flexible display is to be realized, the OLED display device should be bent, which causes stress cracking of the internal structure of the OLED display device, and further challenge a packaging effect of the OLED display device. Therefore, choosing a better package is especially important to the curved or flexible OLED display devices.

The current packaging structure usually uses a packaging cover plate, but the packaging cover plate generally has defects in which it is easily peeled off from the package adhesive (for example, a packaging resin adhesive) and a thermal conductivity is poor, thereby affecting the packaging effect.

Particularly, the packaging structure usually uses a packaging cover plate made of metal or non-metal material to effectively prevent the invasion of water and oxygen. However, such packaging cover plate often has the following problems;

Firstly, the metal packaging cover plate has poor resistance to thermal shock, and once a temperature of the environment changes, the deformation of the metal can easily cause the metal cover plate to peel off from the packaging adhesive, which affects the packaging effect. Moreover, the metal cover plate is more susceptible to damage by the environmental influence.

Secondly, although the non-metal packaging cover plate can avoid the phenomenon of poor thermal shock resistance of the metal cover plate, when the OLED display device is bent, the non-metal packaging cover plate is easily peeled off from the packaging resin adhesive, which will affect the packaging effect. Moreover, the non-metal packaging cover plate has poor heat conductivity.

Figure 1:
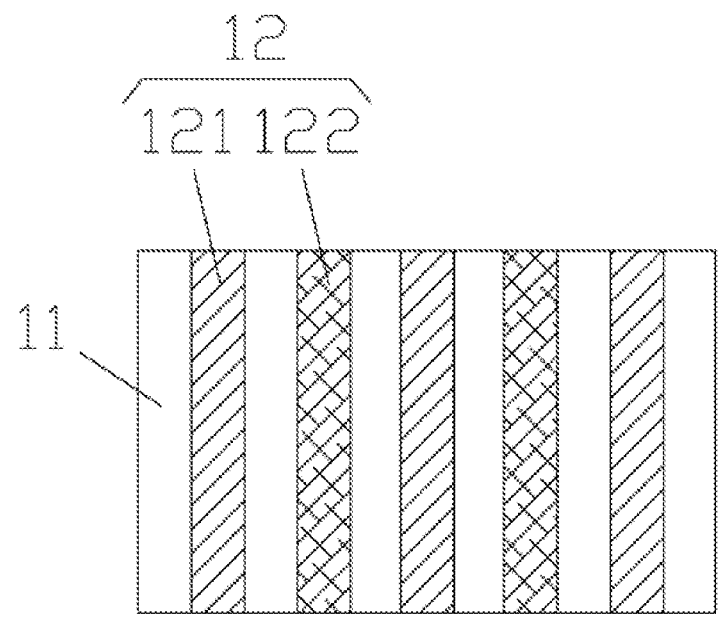
FIG. 1 shows a top plan view of the packaging cover plate according to some embodiments of the present disclosure.
Figure 2:
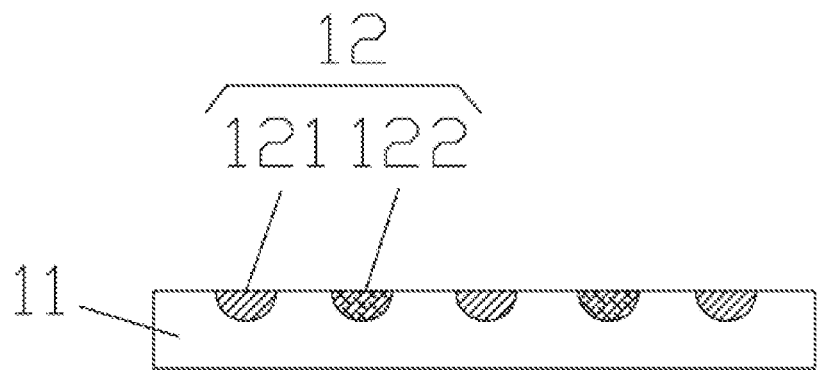
FIG. 2 shows a side view of the packaging cover plate according to some embodiments of the present disclosure.

Referring to FIGS. 1 and 2, some embodiments of the present disclosure provides a packaging cover plate, including a cover plate body 11 and a groove structure 12 disposed on the first surface of the cover plate body 11, wherein the cover plate body 11 comprises a flexible ceramic material, and the groove structure 12 is filled with an adhesive material 121 and a thermally conductive material 122.

Since the cover plate body 11 comprises a flexible ceramic materials (for example, the cover plate body 11 is made of a flexible ceramic material), it has a bending property while having a barrier to water and oxygen, and does not undergo a shape change due to thermal expansion and contraction under a change in ambient temperature. Moreover, by filling the groove structure 12 with a adhesive material, the adhesion between the packaging adhesive (not shown) to be attached to the first surface of the cover plate body 11 and the cover plate body 11 can be improved, and it is ensured that the cover body 11 can resist a stress pull during the bending process, and thus the packaging structure is more stable. The thermally conductive material can improve the heat dissipation effect, and make up for the shortcomings such as low heat dissipation efficiency and uneven heat dissipation of the above-mentioned flexible ceramic material.

Specifically, the groove structure 12 includes a first groove 121 and a second groove 122 that are isolated from each other, and wherein both the first groove 121 and the second groove 122 are linear long grooves and are a plurality of grooves. The first groove 121 and the second groove 122 are parallel to each other and are arranged between each other side by side. The first groove 121 is filled with an adhesive material; and the second groove 122 is filled with a thermally conductive material. The term "filling" herein means that the filling material is filled with the entire groove so that the groove is filled and leveled up.

In practical applications, there may be a space between the adjacent first groove 121 and the second groove 122, which can prevent the adhesive material and the thermally conductive material from contaminating each other during the filling process, causing the filling material to peel off or form protrusions. Alternatively, there may be no space between the adjacent first groove 121 and the second groove 122, which allows the filling material to be distributed over a larger range, thereby allowing the filling material to work more fully.

Preferably, the first groove 121 and the second groove 122 are evenly distributed with respect to the first surface of the cover plate body 11 so as to achieve a more uniform effect of the filling material. Specifically, the first groove 121 and the second groove 122 penetrate throughout the cover plate body 11 in the longitudinal direction, and the intervals between the adjacent a first groove 121 and the second groove 122 are equal.

Further preferably, the width of the first groove 121 and the second groove 122 may range from 0.5 mm to 1 mm, this width range can avoid the formation of depressions in the grooves during the substrate pressing process due to the excessively large groove size, resulting in uneven thickness after forming a cell by aligning and assembling. The interval width between the adjacent first groove 121 and the second groove 122 may range from 0 to 1 mm. The width range can increase the distribution range of the filler material as much as possible while preventing the adhesive material and the thermally conductive material from contaminating each other during the filling process, so that the function of the filler material can be more fully utilized.

The above flexible ceramic material is a composite material composed of a host material and a binder material, wherein the host material is at least one selected from the group consisting of $Al_2O_3$, BN, $ZrO_2$, MgO, $CeO_2$, $Y_2O_3$, $Si_3N_4$, and $La_2O_3$, and the binder material is at least one selected from the group consisting of epoxy resins, rubbers, and paraffin waxes. Specifically, the weight ratio of the host material to the flexible ceramic material may be 50%-90%, and the weight ratio of the binder material to the flexible ceramic material may be 10%-50%.

The composite material has a bending property while having a barrier to water and oxygen, and does not undergo a shape change due to thermal expansion and contraction under a change in ambient temperature. Preferably, the composite material can be made into a thin plate having a thickness of 0.1 mm to 1 mm by a wet method or a casting method, and a groove structure can be formed by a mold.

The above adhesive material may include a coupling agent including organosilane-based material containing an inorganic filler, for example, the coupling agent is at least one of methylvinyldiethoxysilane, methyldiethoxysilane, methyldimethoxysilane, and the like.

The above thermally conductive material includes at least one of graphene, carbon nanotubes, graphite powder, aluminum oxide, and aluminum nitride.

Figure 3:
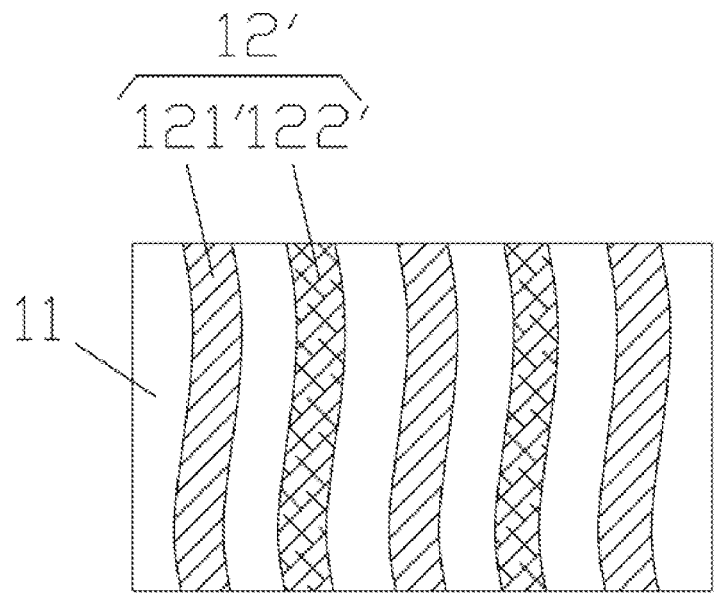
FIG. 3 shows a top plan view of the packaging cover plate according to a modified embodiment of the present disclosure.

As a variant of the invention, as shown in FIG. 3, the groove structure 12' includes a first groove 121' and a second groove 122' that are isolated from each other, both of which are a curved long groove. Both the first groove 121' and the second groove 122' are a plurality of grooves and parallel to each other, and the first groove 121' and the second groove 122' are arranged between each other. The curved groove is preferably a wavy groove.

Compared with the linear long grooves in the above embodiment, the curved long grooves can allow the distribution of the filling material broader, the heat conductivity more sufficiently, and the adhesion stronger.

The other structure of the packaging cover plate provided by this variant is the same as that of the above embodiment, and the details thereof are not described herein again.

It should be noted that in some embodiments of the present disclosure, the first groove and the second groove as described above are both linear long grooves or curved long grooves. However, the present disclosure is not limited thereto. In the practical applications, the first groove or the second groove as described above may also be in any other shape, such as a dot shape. In addition, the second groove filled with the thermally conductive material preferably adopts a linear long groove or a curved long groove to ensure that the conduction path of the heat is connected, so that heat dissipation efficiency can be ensured.

Figure 4:
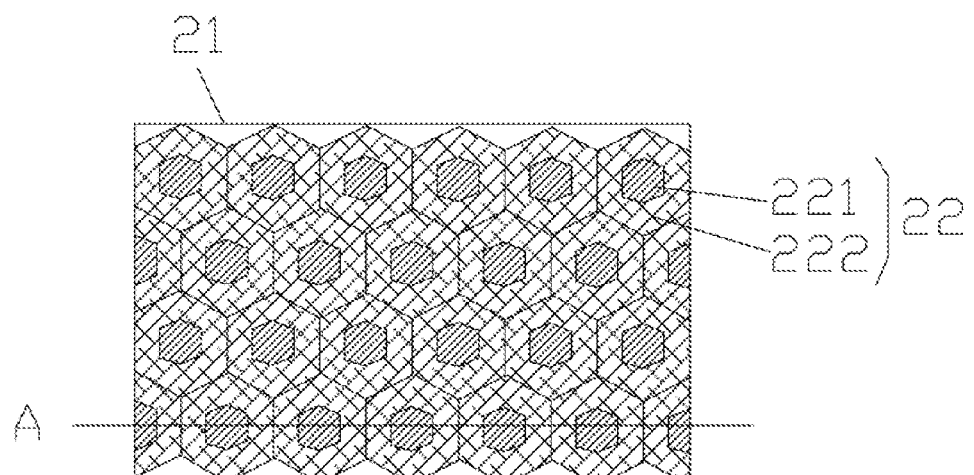
FIG. 4 shows a top plan view of the packaging cover plate according to some embodiments of the present disclosure.
Figure 5:
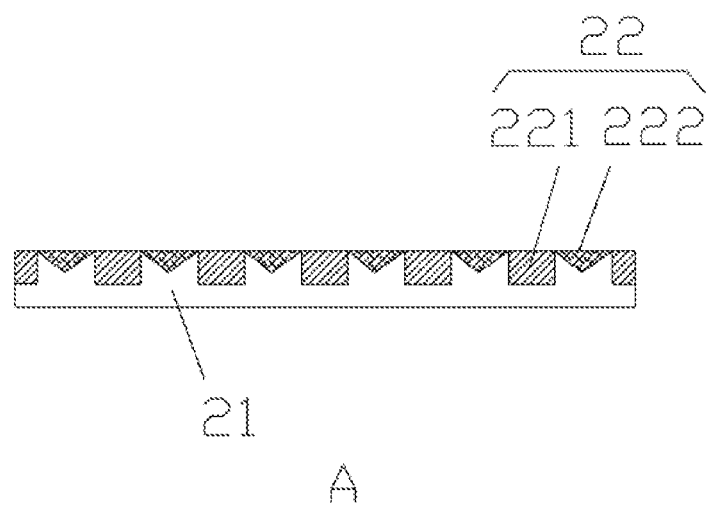
FIG. 5 shows a cross-sectional view of the packaging cover plate according to some embodiments of the present disclosure in line A of FIG. 4.

Referring to FIGS. 4 and 5 together, some embodiments of the present disclosure provide a packaging cover plate, wherein the packaging cover plate is different from those of the above embodiments only in that the groove structure is different.

Specifically, a packaging cover plate includes a cover plate body 21 including a flexible ceramic material, and a groove structure 22 disposed on a first surface of the cover plate body 21, wherein the groove structure 22 is filled with an adhesive material and a thermally conductive material.

The groove structure 22 includes a first groove 221 and a second groove 222 that are isolated from each other, the first groove 221 are a regular hexagonal groove; the second groove 222 are a regular hexagonal ring groove surrounding the first groove 221; and the six sides of the first groove 221 are in one-to-one correspondence with the inner six sides of the second groove 222.

In this embodiment, the second groove 222 are a plurality of grooves, and the outer six sides of any one of the second groove 222 coincide with the outer side of six of the second groove 222 adjacent thereto, and a plurality of the second groove 222 cover the entire first surface of the cover plate body 21; the inner six sides of the second groove 222 are in one-to-one correspondence with the six sides of the first groove 221, and coincide with the six sides of the first groove respectively.

The overall structure of the above groove structure 22 is similar to a "honeycomb" structure, which can make the distribution space of the groove more tight and continuous. Moreover, since the first groove 221 has have a sharp corner of the regular hexagonal grooves, the phenomenon of cross-contamination of the process can be avoided to a large extent, and moreover, the distribution range of the adhesive material can be increased to ensure adhesion to the packaging adhesive. Since the second groove 222 adopts a regular hexagonal ring groove, the conduction path length of the heat can be increased, thereby further improving the heat dissipation efficiency.

It should be noted that, in this embodiment, the first groove 221 are a regular hexagonal groove; the second groove 222 are a regular hexagonal ring groove surrounding the first groove 221. However, the present disclosure is not limited thereto, and in practical applications, the first groove 221 and the second groove 222 may also adopt other polygons, such as a quadrangle or the like.

As another embodiment, the present disclosure also provides a light emitting diode display, including a substrate, an light emitting diode functional layer on the substrate, a packaging adhesive, the packaging cover plate mentioned above and a drying member, wherein the packaging adhesive is applied on a first surface of the cover plate body, thereby completing the packaging. The light emitting diode display can be an organic light emitting diode display or an inorganic light emitting diode display.

As another embodiment, the present disclosure also provides a method for manufacturing a packaging cover plate, including:

a step of providing a cover plate body comprising a flexible ceramic material, for example, the cover plate body is made of a flexible ceramic material;

a step of forming a groove structure on a first surface of the cover plate body; and a step of filling the groove structure with an adhesive material and a thermally conductive material.

Preferably, the step of filling the groove structure with an adhesive material and a thermally conductive material includes:

formulating the adhesive material into a solution using a solvent (preferably a dilute solution having a concentration of 0.5% by mass to 1% by mass); and formulating the thermally conductive material into a paste using a solvent;

filling the solution into the groove structure by knife coating, spray coating or inkjet printing; and filling the paste into the groove structure by screen printing, spray coating or spot coating; and drying the dilute solution and the paste in the groove structure.

The above solvent may be methanol or ethanol or the like. The mass fraction (concentration) of the above solution may be from 0.5% to 1%. The volume ratio of the above paste may be from 50% to 80%, The drying temperature may be from 80° C. to 100° C.

By using a solvent to dilute the filling material, the implementation of the interstitial process is facilitated, and the material filling is prevented from being uneven and incomplete.

Specific embodiments of the method for manufacturing the packaging cover plate are described in detail below for different groove structures.

The first groove structure 12 includes a first groove 121 and a second groove 122 that are isolated from each other, both of which are linear long grooves, as shown in FIG. 1. Specifically, a flexible ceramic material having a thickness of 0.5 mm is selected as the cover plate body. The interval between the adjacent first groove 121 and the second groove 122 is 1 mm, and the linear long groove has a width of 1 mm and a depth of 0.1 mm.

The first groove 121 is coated with an ethanol solution of methylvinyldiethoxysilane having a mass fraction of 1%, and the second groove 122 are coated with a graphene paste having a concentration of 60% by volume, then the manufacture of the cover plate body was completed by baking in an oven having a drying temperature of 80° C. for 1 hour. Thereafter, a thermosetting resin adhesive is applied to the first surface of the cover plate body 12 to complete the packaging of the OLED display device.

The second groove structure 12' includes a first groove 121' and a second groove 122' that are isolated from each other, both of which are curved long grooves as shown in FIG. 3. A flexible ceramic material with a thickness of 0.1 mm is used as the cover plate body. The interval between the adjacent first groove 121' and the second groove 122' is 0.5 mm, and the curved long groove has a width of 1 mm and a depth of 0.05 mm.

The first groove 121' is coated with an methanol solution of methyldiethoxysilane having a mass fraction of 0.5%, and the second groove 122' is coated with an alumina paste having a concentration of 80% by volume, then the manufacture of the cover plate body was completed by baking in an oven having a drying temperature of 100° C. for 1 hour. Thereafter, an ultraviolet curable resin adhesive is applied to a first surface of the cover plate body 12' so as to complete the packaging of the OLED display device.

The third groove structure 22 including a first groove 221 and a second groove 222 that are isolated from each other, wherein the first groove 221 are regular hexagonal grooves; the second groove 222 are regular hexagonal ring grooves surrounding the first groove 221, as shown in FIG. 4.

A flexible ceramic material with a thickness of 1 mm is used as the cover plate body. The first groove 221 has a side length of 0.5 mm and a depth of 0.5 mm; the second groove 222 has a depth of 0.2 mm.

The first groove 221 is coated with an methanol solution of methyldimethoxysilane having a mass fraction of 0.8%, and the second groove 222 is coated with a graphene paste having a concentration of 60% by volume, then the manufacture of the cover plate body was completed by baking in an oven having a drying temperature of 100° C. for 1 hour. Thereafter, a thermosetting resin adhesive is applied to the first surface of the cover plate main body 12' so as to complete the packaging of the OLED display device.

The present disclosure has the following advantageous effects:

in the technical solution of the packaging cover plate and the method for manufacturing the same provided by the present disclosure, since the cover plate body comprises a flexible ceramic material, it has a bending property while having a barrier to water and oxygen, and does not undergo a shape change due to thermal expansion and contraction under a change of ambient temperature. Moreover, a groove structure is provided on the first surface of the cover plate body, and the groove structure is filled with an adhesive material and a thermally conductive material. The adhesive material can improve the adhesion between the package cover plate and the packaging adhesive, thereby ensuring resistance to the stress cracking during the bending process and making the packaged structure more stable. And the thermally conductive material can improve a heat dissipation effect.

In summary, according to the packaging cover plate and the method for manufacturing the same provided by the present disclosure, since the cover plate body comprises a flexible ceramic material (for example, the cover plate body is made of a flexible ceramic material), it has a bending property while having a barrier to water and oxygen, and does not undergo a shape change due to thermal expansion and contraction under the change of an ambient temperature. Moreover, a groove structure is provided on the first surface of the cover plate body, and the groove structure is filled with an adhesive material and a thermally conductive material. The adhesive material can improve the adhesion between the package cover plate and the packaging adhesive, thereby ensuring resistance to the stress cracking during the bending process and making the packaging structure more stable. And the thermally conductive material can improve the heat dissipation effect.

It is to be understood that the above embodiments are merely exemplary embodiments employed to explain the principles of the invention, but the invention is not limited thereto. Various modifications and improvements can be made by those skilled in the art without departing from the spirit and scope of the invention, and these modifications and improvements are also considered to be within the scope of the invention.

The invention claimed is:

1. A light emitting diode display including: a substrate, a light emitting diode functional layer on the substrate, a packaging adhesive and a packaging cover plate, the packaging cover plate including a cover plate body and a groove structure disposed on a first surface of the cover plate body, wherein the cover plate body comprises a flexible ceramic material, and the groove structure includes a first groove and a second groove that are isolated from each other, wherein the packaging adhesive is a thermosetting resin adhesive or an ultraviolet curable resin adhesive;

the first groove is filled with an adhesive material for ensuring adhesion of the cover plate body to the packaging adhesive wherein the adhesive material is organosilane-based materials containing inorganic fillers; and the second groove is filled with a thermally conductive material, wherein the first groove is a regular hexagonal groove; the second groove is a regular hexagonal ring groove surrounding the first groove; and the six sides of the first groove are in one-to-one correspondence with the inner six sides of the second groove, and wherein the second groove is a plurality of grooves, and the outer six sides of any of the plurality of the second grooves coincide with the outer six sides of the plurality of the second grooves adjacent thereto, and the first groove and the plurality of the second grooves cover the entire first surface of the cover plate body;

the inner six sides of the second groove are in one-to-one correspondence with the six sides of the first groove, and coincide with the six sides of the first groove respectively, wherein the packaging adhesive is applied on the first surface of the cover plate body, thereby completing packaging of the light emitting diode functional layer on the substrate to prevent invasion of water and oxygen.

2. The light emitting diode display according to claim 1, wherein the flexible ceramic material is a composite material composed of a host material and a binder material;

the host material is at least one selected from the group consisting of $Al_2O_3$, BN, $ZrO_2$, MgO, $CeO_2$, $Y_2O_3$, $Si_3N_4$, and $La_2O_3$; and the binder material is at least one selected from the group consisting of epoxy resins, rubbers, and paraffin waxes.

3. The light emitting diode display according to claim 1, wherein the thermally conductive material is at least one selected from the group consisting of graphene, carbon nanotubes, graphite powder, aluminum oxide, and aluminum nitride.

* * * * *